(12) United States Patent
Xie et al.

(10) Patent No.: US 12,009,435 B2
(45) Date of Patent: Jun. 11, 2024

(54) INTEGRATED NANOSHEET FIELD EFFECT TRANSISTORS AND FLOATING GATE MEMORY CELLS

(71) Applicant: International Business Machines Corporation, Armonk, NY (US)

(72) Inventors: Ruilong Xie, Niskayuna, NY (US); Julien Frougier, Albany, NY (US); Veeraraghavan S. Basker, Schenectady, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 17/473,151

(22) Filed: Sep. 13, 2021

(65) Prior Publication Data

US 2023/0085033 A1 Mar. 16, 2023

(51) Int. Cl.
| | | |
|---|---|---|
| *H01L 29/788* | (2006.01) | |
| *H01L 21/02* | (2006.01) | |
| *H01L 21/28* | (2006.01) | |
| *H01L 29/06* | (2006.01) | |
| *H01L 29/423* | (2006.01) | |

(Continued)

(52) U.S. Cl.
CPC ...... *H01L 29/7883* (2013.01); *H01L 21/0259* (2013.01); *H01L 29/0665* (2013.01); *H01L 29/40114* (2019.08); *H01L 29/42392* (2013.01); *H01L 29/66545* (2013.01);
(Continued)

(58) Field of Classification Search
CPC .......... H01L 29/7883; H01L 21/0259; H01L 29/0665; H01L 29/40114; H01L 29/42392; H01L 29/66545; H01L 29/66742; H01L 29/66825; H01L 29/78696; H01L 29/0673;
(Continued)

(56) References Cited

U.S. PATENT DOCUMENTS

| | | |
|---|---|---|
| 8,102,006 B2 | 1/2012 | Zhou |
| 8,379,458 B1 | 2/2013 | Or-Bach |

(Continued)

FOREIGN PATENT DOCUMENTS

| | | |
|---|---|---|
| JP | 5553478 B2 | 7/2014 |
| KR | 1020170085934 A | 7/2017 |
| WO | 2011036214 A1 | 3/2011 |

OTHER PUBLICATIONS

Lawrence, A.P., 'A Nonvolatile Memory Overview', Oct. 2004, downloaded from URL<https://aplawrence.com/Makwana/nonvolmem.html> on Nov. 13, 2023. (Year: 2004).*

(Continued)

*Primary Examiner* — J. E. Schoenholtz
(74) *Attorney, Agent, or Firm* — David K. Mattheis

(57) ABSTRACT

A semiconductor device including a nanosheet field effect transistor (FET) comprising a thin gate oxide layer and a floating gate memory cell comprising a tunneling oxide, a floating gate, and a blocking oxide layer over a fin FET device. The device fabricated by forming a nanosheet stack and fin structures, forming tunneling oxide and floating gate layers over the nanosheet stack and fin structures, forming dummy gate structures over the nanosheet stack and fin structures, removing the dummy gate structures, forming a blocking oxide layer over the floating gate, and forming replacement metal gates.

19 Claims, 16 Drawing Sheets

(51) Int. Cl.
*H01L 29/66* (2006.01)
*H01L 29/786* (2006.01)

(52) U.S. Cl.
CPC .. *H01L 29/66742* (2013.01); *H01L 29/66825* (2013.01); *H01L 29/78696* (2013.01)

(58) Field of Classification Search
CPC ............. H01L 29/66439; H01L 29/775; H01L 29/7881; B82Y 10/00; H10B 43/00
See application file for complete search history.

(56) References Cited

U.S. PATENT DOCUMENTS

| | | |
|---|---|---|
| 8,581,349 B1 | 11/2013 | Sekar |
| 8,722,472 B2 | 5/2014 | Chang |
| 9,230,989 B2 | 1/2016 | Chang |
| 9,659,655 B1 | 5/2017 | Chan |
| 9,899,397 B1 | 2/2018 | Leobandung |
| 10,283,516 B1 | 5/2019 | Reznicek |
| 10,916,629 B2 | 2/2021 | Reznicek |
| 11,114,563 B2* | 9/2021 | Chang ................. H01L 27/1203 |
| 11,605,729 B2* | 3/2023 | Hall ................... H01L 29/42324 |
| 2004/0229422 A1* | 11/2004 | Mori ................. H01L 29/42324 |
| | | 257/E29.129 |
| 2007/0029600 A1 | 2/2007 | Cohen |
| 2013/0187215 A1 | 7/2013 | Sandhu |
| 2014/0159114 A1 | 6/2014 | Zheng |
| 2018/0033797 A1* | 2/2018 | Colinge ............ H01L 29/40114 |
| 2022/0278226 A1* | 9/2022 | Hall ....................... H01L 29/401 |

OTHER PUBLICATIONS

Loubet, N., et al. "Stacked nanosheet gate-all-around transistor to enable scaling beyond finfet." 2017 Symposium on VLSI Technology, 2017, https://doi.org/10.23919/vlsit.2017.7998183. (Year: 2017).*

* cited by examiner

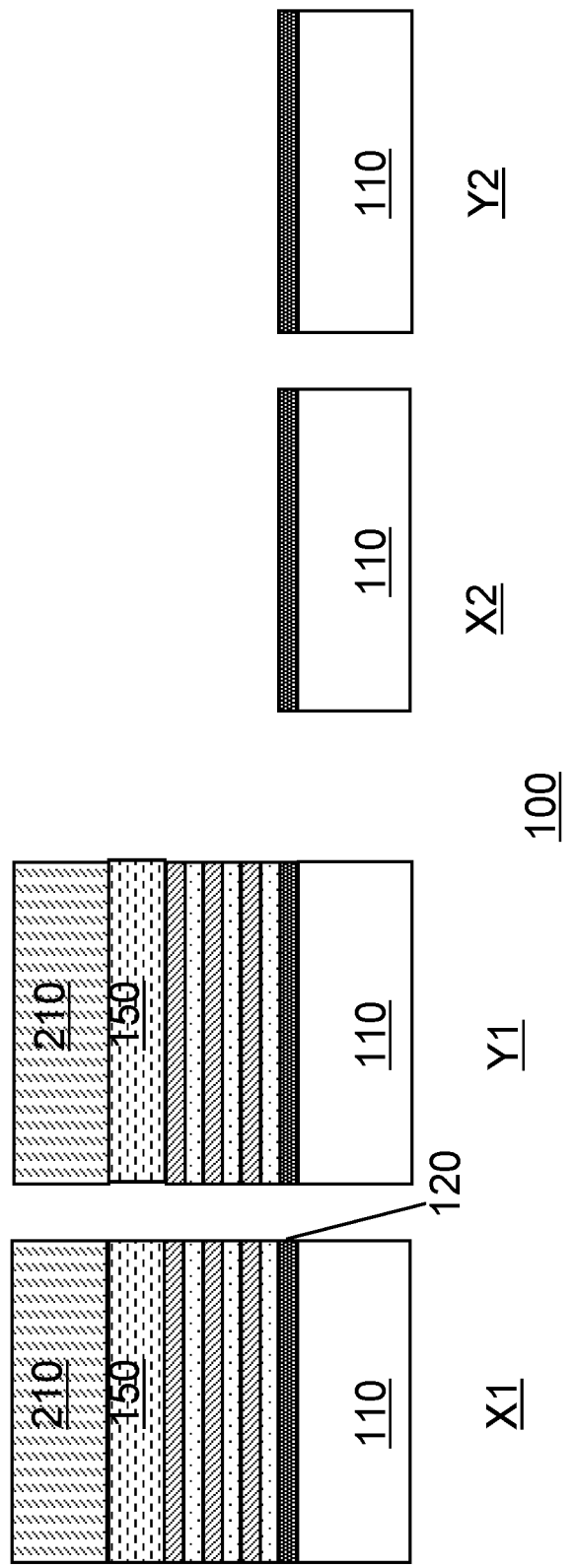

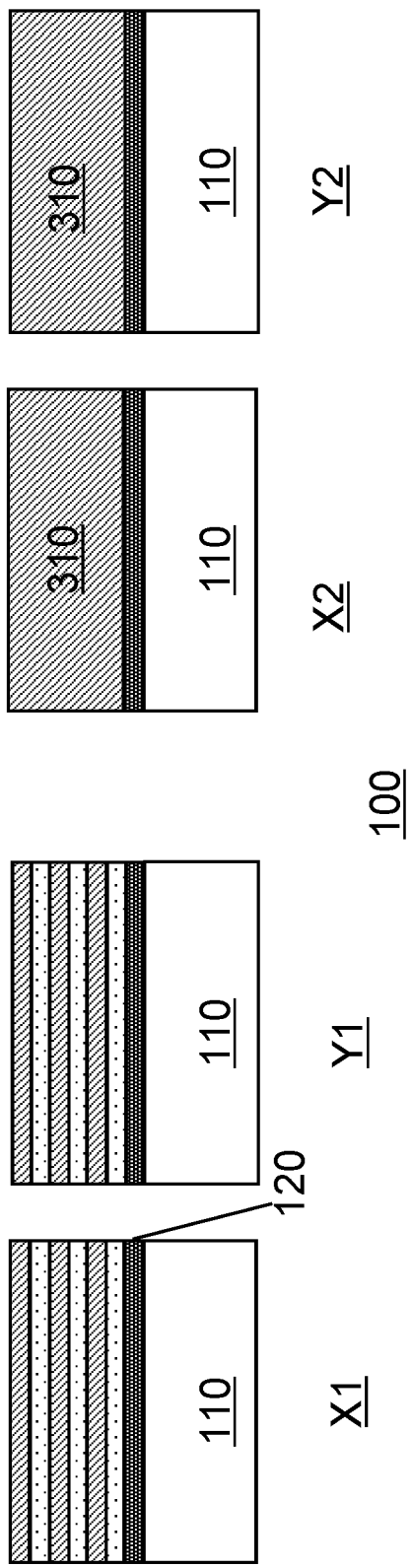

ＵＳ 12,009,435 B2

INTEGRATED NANOSHEET FIELD EFFECT TRANSISTORS AND FLOATING GATE MEMORY CELLS

BACKGROUND

The disclosure relates generally to integrated field effect transistors (FET) and floating gate memory cells. The disclosure relates particularly to nanosheet FETs and floating gate memory cells having a common die level and sharing fabrication steps.

Nanosheet FET devices include a plurality of stacked semiconductor nanosheet channels disposed between doped semiconductor source/drain regions, a control gate contact to switch the device on and off, and S/D contacts. Application of voltage to the device through the gate enables current flow through the channels between the respective S/D regions and contacts.

Floating gate memory cells include an isolated semiconductor gate disposed between a control gate and one or more semiconductor channels disposed between doped semiconductor source/drain regions. Application of a voltage through the control gate alters the state of the floating gate. The altered state persists after removal of the control gate voltage.

Fabrication of system-on-a-chip structures include forming central processor structures including millions of transistors as well as cache memory structures including billions of memory cells on a single die of a multi-die wafer.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device including a nanosheet field effect transistor (FET) comprising a thin gate oxide layer and a floating gate memory cell comprising a tunneling oxide, a floating gate, and a blocking oxide layer over a fin FET device. The device fabricated by forming a nanosheet stack and fin structures, forming tunneling oxide and floating gate layers over the nanosheet stack and fin structures, forming dummy gate structures over the nanosheet stack and fin structures, removing the dummy gate structures, forming a blocking oxide layer over the floating gate, and forming replacement metal gates.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

FIG. 2 provides a cross-sectional view of a step in the fabrication of a semiconductor device, according to an embodiment of the invention. The figure illustrates removal of nanosheets in the area of the floating gate memory cell.

FIG. 3 provides a cross-sectional view of a step in the fabrication of a semiconductor device, according to an embodiment of the invention. The figure illustrates the device after the formation of a semiconductor layer for floating gate memory cell fins.

DETAILED DESCRIPTION

Figure 1A:
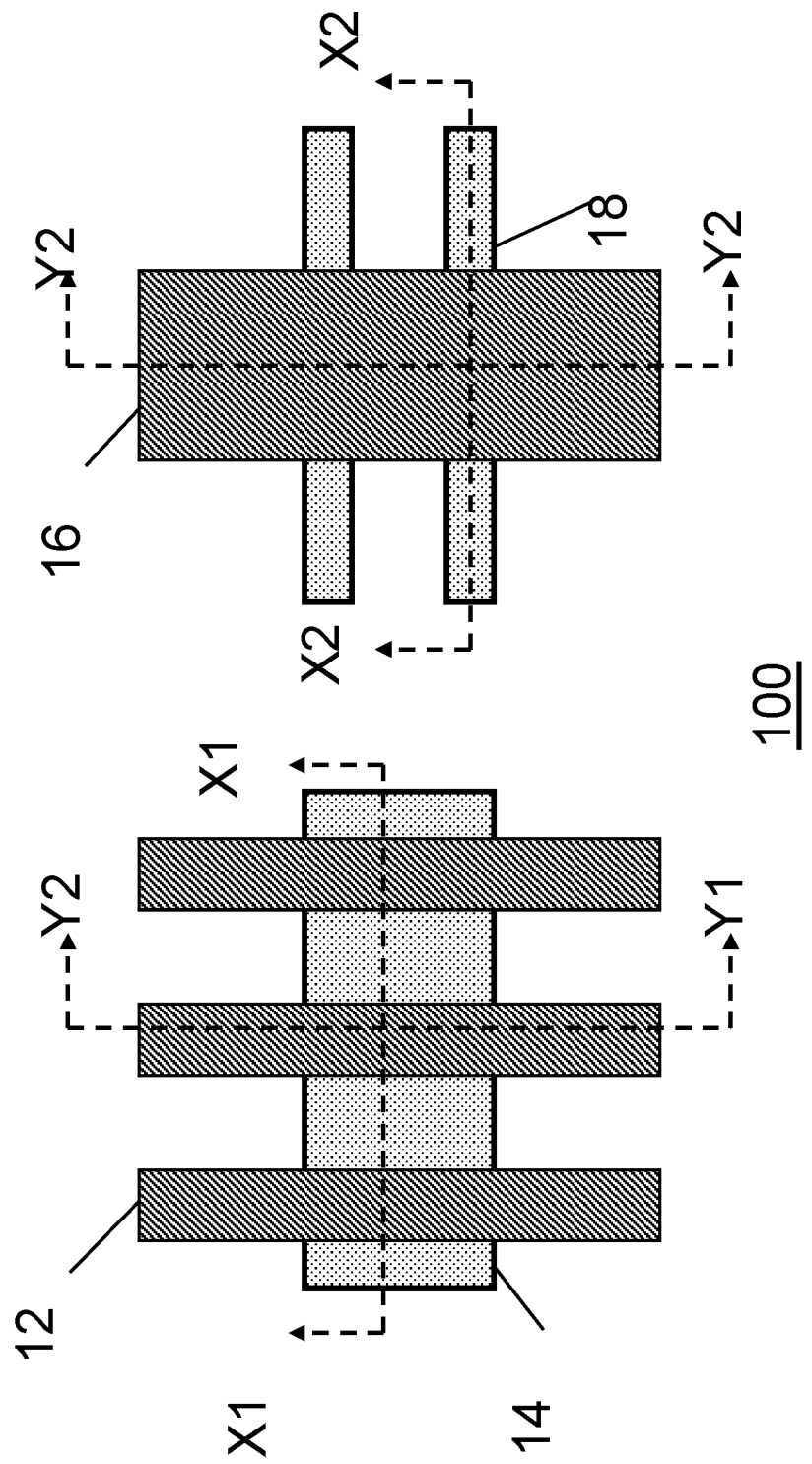
FIG. 1A provides a schematic plan view of device, according to an embodiment of the invention. The figure illustrates the location of the section lines associated with the respective views of FIGS. 1B-15.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

As used herein, the term "nanosheet" denotes a substantially two-dimensional structure with thickness in a scale ranging from 1 to 100 nm. The width and length dimensions of the nanosheet may be greater than the thickness dimensions.

Disclosed embodiments relate to system-on-a-chip devices including one or more central processors and cache memory portions. CPUs comprise transistors and the cache memory comprises floating gate memory cells. Fabrication of such devices may be simplified through disclosed methods as transistors and memory cells may be concurrently formed at a common level of the device using fabrication steps common to both the transistors and memory cells. This method reduces the number of fabrication steps necessary for the formation of the device saving time and resources in the overall fabrication.

Reference is now made to the figures. The figures provide schematic cross-sectional illustrations of semiconductor devices at intermediate stages of fabrication, according to one or more embodiments of the invention. The figures provide a cross-section X1 which extends along the nanosheets and parallel to the nanosheets, and a cross-section Y1 which extends perpendicular to nanosheets and along the gate of the nanosheet transistors. The figures provide cross-section X2 which extends along the fins and parallel to the fins and cross-section Y2 which extends perpendicular to the fins and along the gate of the floating gate memory portion of the device. The figures provide schematic representations of the devices of the invention and are not to be considered accurate or limiting with regards to device element scale.

Nanosheet (NS) transistors are being pursued as a viable device architecture for scaling CMOS devices beyond 5 nm node. Floating gate memory structure provide programmable persistent data storage for a device. Disclose embodiments enable the concurrent fabrication of both nanosheet transistors and floating gate memory cells for the system-on-a-chip device.

FIG. 1A provides a plan view of the nanosheet (NS) transistor and floating gate memory portions of a device 100. As shown in the Figure, the NS device includes nanosheet stack 14 and device gates 12. Floating gate memory includes fins 18 and gates 16. Section lines X1, X2, Y1 and Y2, indicate the point-of-view presented in FIGS. 1B-15.

Figure 1B:
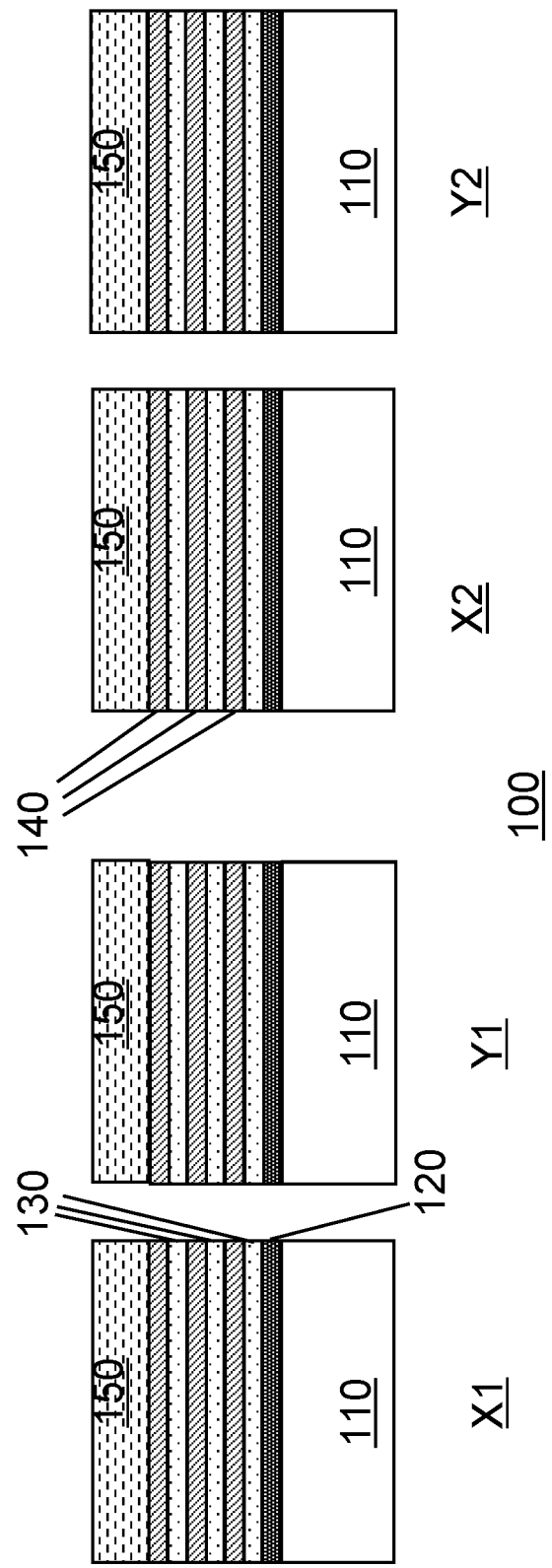
FIG. 1B provides a cross-sectional view of a step in the fabrication of a semiconductor device, according to an embodiment of the invention. The figure illustrates formed stacks of epitaxially grown nanosheet layers.

FIG. 1B provides a cross-sectional view of a device 100 according to an embodiment of the invention at a first intermediate stage of fabrication. For the purpose of clarity, several fabrication steps leading up to the production of the semiconductor structure as illustrated in FIG. 1B are omitted. In other words, the semiconductor structure does not necessarily start out in the form illustrated in FIG. 1B, but may develop into the illustrated structure over one or more well-known processing steps which are not illustrated but are well-known to those of ordinary skill in the art. As shown in the Figure, alternating nanosheets of a sacrificial compound semiconductor material 130 and elemental semiconductor material 140 are disposed upon an underlying sacrificial layer 120, which is in turn disposed upon an underlying semiconductor substrate 110 and an optional buffer layer (not shown).

The semiconductor substrate 110 may include any semiconductor material including, for example, silicon. The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (Si-GeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. In one embodiment, the optional buffer is comprised of a III-V compound (e.g., alloy). For example, optional buffer may be comprised of gallium arsenide phosphide ($GaAs_{1-x}P_x$). However, the optional buffer may be comprised of any material suitable for use in accordance with the embodiments described herein.

In an embodiment, the nanosheet stack is comprised of alternating nanosheet layers. For example, as shown in FIG. 1B, the nanosheet stack comprises first nanosheet layers 140 comprising a first material and second nanosheet layers 130 comprising another material deposited upon sacrificial semiconductor layer 120 comprising a third semiconductor material. In general, the nanosheet stack structure comprises second nanosheet layers 130 disposed between adjacent first nanosheet layers 140. Each nanosheet layer of nanosheet stack may have a thickness ranging from about 3 nm to about 20 nm, although thinner or thicker nanosheets are also possible. FIG. 1B illustrates a stack including three sacrificial layers 130 and three semiconductor channel layers 140 although other configurations have more or fewer numbers of layers 130 and 140 are possible.

The nanosheet stack can be formed by epitaxially growing the nanosheet stack with the second nanosheet layers 130 between adjacent first nanosheet layers 140. In one embodiment, first nanosheet layers 140 are comprised of silicon. In another embodiment, second nanosheet layers 130 can be comprised of $Si_xGe_y$ where x and y represent relative atomic concentration of silicon (Si) and germanium (Ge), respectively. X and y are less than 1 and their sum is equal to 1. In some embodiments, x is equal to 0.75 and y is equal to 0.25.

In an embodiment, each sacrificial semiconductor material layer 130 and 120, is composed of a first semiconductor material which differs in composition from at least an upper portion of the semiconductor substrate 110. In one embodiment, the upper portion of the semiconductor substrate 110 is composed of silicon, while each sacrificial semiconductor material layers 130 and 120 is composed of a silicon germanium alloy. In such an embodiment, the SiGe alloy that provides each sacrificial semiconductor material layer 120 has a germanium content that is greater than 45 atomic percent germanium. In one example, the SiGe alloy that provides each sacrificial semiconductor material layer 120 has a germanium content from 45 atomic percent germanium to 70 atomic percent germanium. In such an embodiment, the SiGe alloy that provides each sacrificial semiconductor material layer 130 has a germanium content that is less than 45 atomic percent germanium. In one example, the SiGe alloy that provides each sacrificial semiconductor material layer 130 has a germanium content from 15 atomic percent germanium to 35 atomic percent germanium. The first semiconductor material that provides each sacrificial semiconductor material layers 130 and 120 can be formed utilizing an epitaxial growth (or deposition process).

Each first nanosheet layer 140, is composed of a second semiconductor material, such as Si, that has a different etch rate than the first semiconductor material of the sacrificial semiconductor material layers 130 and 120. The second semiconductor material of each semiconductor channel material layer 140, may be the same as, or different from, the semiconductor material of at least the upper portion of the semiconductor substrate 110. The second semiconductor material can be a SiGe alloy provided that the SiGe alloy has a germanium content that is less than 45 atomic percent germanium, and that the first semiconductor material is different from the second semiconductor material.

In one example, at least the upper portion of the semiconductor substrate 110 and each semiconductor channel material layer 140 is composed of Si or a III-V compound semiconductor, while each sacrificial semiconductor material layer 130, 120 is composed of a silicon germanium alloy. The second semiconductor material of each semiconductor channel material layer 140, can be formed utilizing an epitaxial growth (or deposition process).

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

As shown in FIG. 1B, the stacked layers are protected by hardmask 150. In an embodiment, hardmask 150 includes a nitride, oxide, an oxide-nitride bilayer, or another suitable material. In some embodiments, the hardmask 150 may include an oxide such as silicon oxide (SiO), a nitride such as silicon nitride (SiN), an oxynitride such as silicon oxynitride (SiON), combinations thereof, etc. In some embodiments, the hardmask 150 is a silicon nitride such as $Si_3N_4$.

FIG. 2 illustrates device 100 following lithography patterning and etching of nanosheet and hardmask stack (150, 140, and 130) to form floating gate memory region. The lithographic patterning stack may include organic planarization layer 210 such as OPL, followed by ARC layer (such as SiARC, not shown) and photo resist (not shown). After lithographic exposure and development, photo resist in floating gate memory region is removed, followed by SiARC, OPL and nanosheet stack etch, down to the upper surface of the lowest sacrificial layer 120.

Etching generally refers to the removal of material from a substrate (or structures formed on the substrate) and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching.

FIG. 3 illustrates device 100 following epitaxial growth of new semiconductor material 310, such as silicon, upon the exposed sacrificial layer 120, after removal of the remaining OPL 210 layer through, for example, an ashing process. The Figure further illustrates the device following selective removal of hardmask 150 through for example, selective wet etch process.

Figure 4:
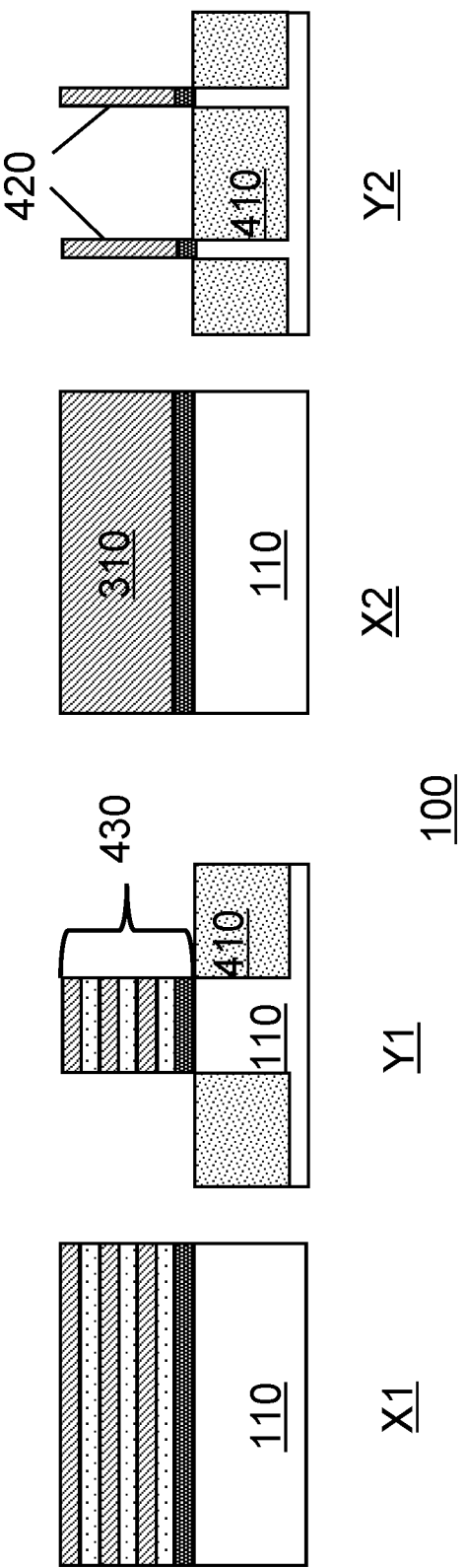
FIG. 4 provides a cross-sectional view, of a step in the fabrication of a semiconductor device, according to an embodiment of the invention. The figure illustrates the device after the formation fins for the FET and floating gate memory cell.

FIG. 4 illustrates device 100 following the masking, patterning, and selective etching of semiconductor layers 130, 140, 310, 120, and top portions of substrate 110, to form nanosheet stack fins 430, and floating gate memory cell fins 420. As shown in the Figure, the layers of the nanosheet stack have been patterned and selectively etched using lithographic techniques and etching process such as reactive ion etching (RIE). The lithographic patterning process could be any conventional technique used for fin patterning, such as SADP, SAQP, direct EUV patterning, multiple lithographic/etch process, etc. The etching proceeds into substrate 110. Deposition of a shallow trench isolation material 410, such as silicon dioxide, or any suitable combination of multiple dielectric materials (e.g., silicon nitride and silicon oxide), occurs after the formation of shallow trench isolation (STI) regions 410 between NS stack circuit elements and floating gate memory cell fins of the device. Following such deposition, an oxide planarization (e.g. by CMP) and recess process trims the upper surface of STI regions 410 to the level of the underlying substrate 110. STI regions 410 provide electrical isolation between adjacent NS transistors as well as between adjacent floating gate memory cells of the device.

Figure 5:
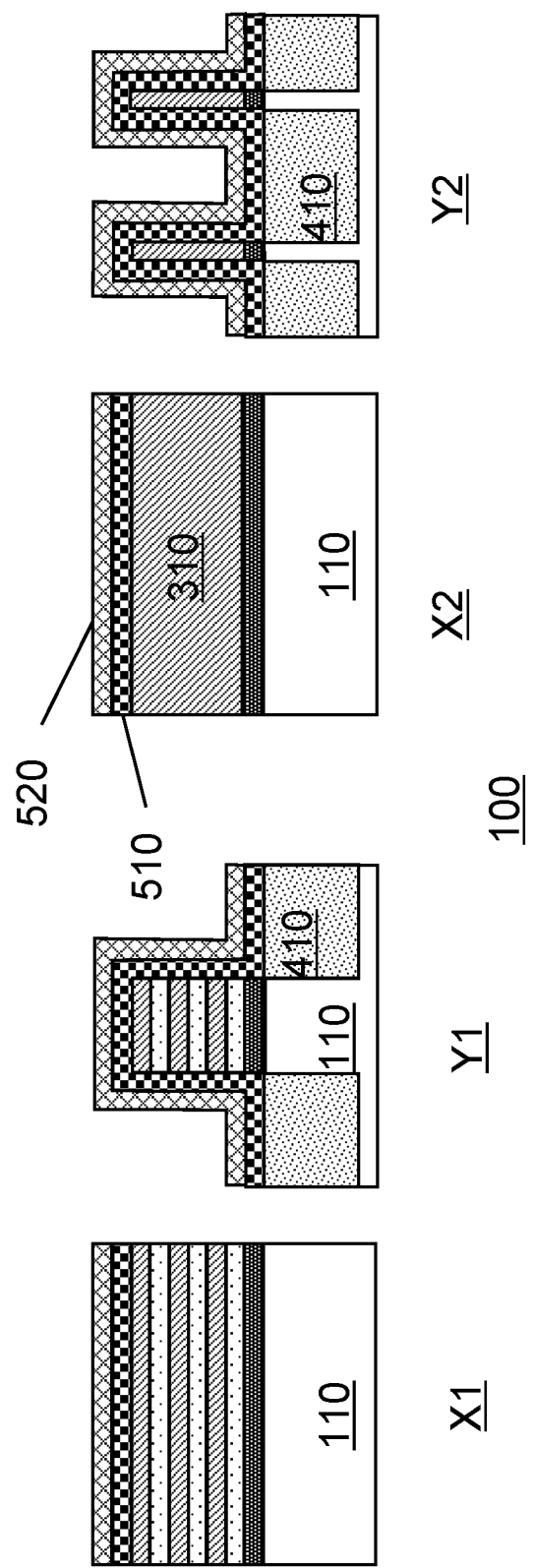
FIG. 5 provides a cross-sectional view of a step in the fabrication of a semiconductor device, according to an embodiment of the invention. The figure illustrates the device after the conformal deposition of tunneling and floating gate layers.

FIG. 5 illustrates device 10 following the successive conformal deposition of tunneling gate dielectric layer 510, such as $SiO_2$, or similar oxide materials, and then floating gate layer 520. Deposition method such as chemical vapor deposition, ALD, or thermal oxidation may be used for the deposition of the tunneling gate dielectric layer 510. LPCVD provides for the formation of the floating gate memory material layer such as poly-crystalline silicon.

Figure 6:
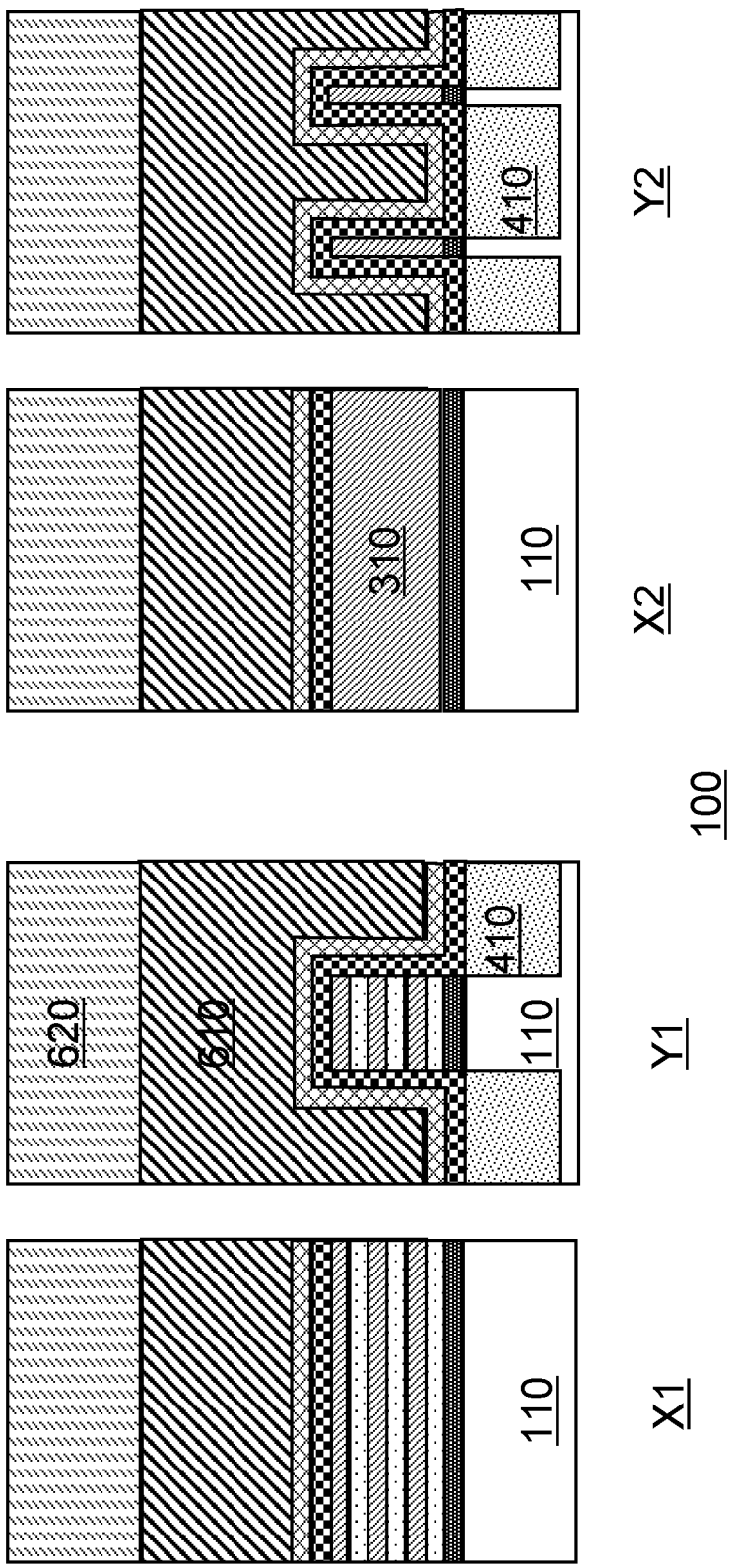
FIG. 6 provides a cross-sectional view of a step in the fabrication of a semiconductor device, according to an embodiment of the invention. The figure illustrates the device after deposition of dummy gate layers.

FIG. 6 illustrates device 100 following deposition of dummy gate layers, including sacrificial SiGe layer 610, and a hardmask layer 620. In an embodiment, the method forms the sacrificial layer from a material such as $SiGe_{25}$. In an embodiment, hardmask 620 comprises a nitride, oxide, an oxide-nitride bilayer, or another suitable material. In some embodiments, the hardmask 620 may include an oxide such as silicon oxide (SiO), a nitride such as silicon nitride (SiN), an oxynitride such as silicon oxynitride (SiON), combinations thereof, etc. In some embodiments, the hardmask 620 is a silicon nitride such as $Si_3N_4$.

Figure 7:
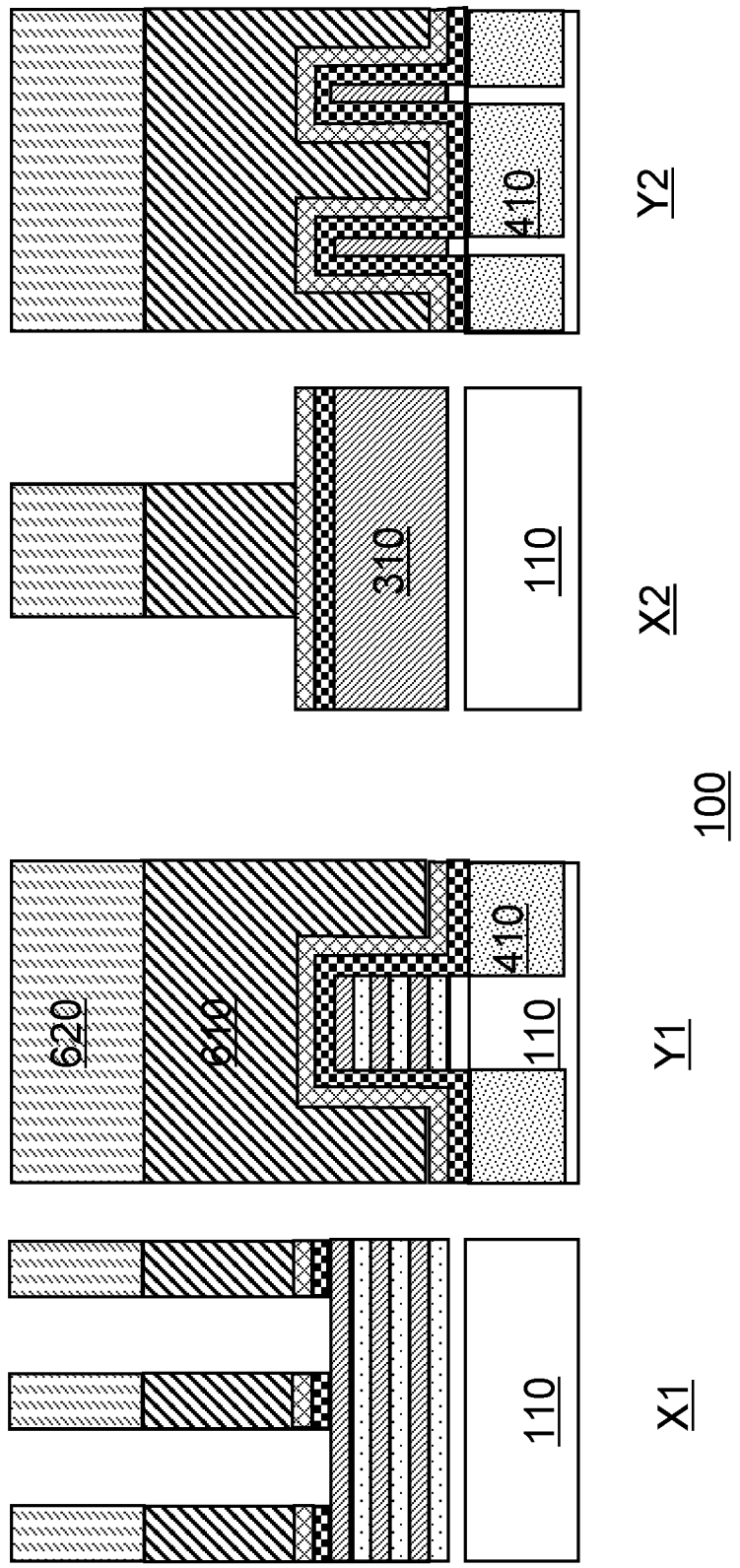
FIG. 7 provides a cross-sectional view of a step in the fabrication of a semiconductor device, according to an embodiment of the invention. The figure illustrates the device after the formation of dummy gate structures.

FIG. 7 illustrates device 100 following the masking, patterning and selective etching of hardmask 620 and sacrificial material layer 610, to form dummy gate structures of each of the nanosheet FET and floating gate memory cells. The Figure further illustrates the selective etching removal of sacrificial semiconductor layer 120 from beneath each of the FET stacks and the floating gate memory fins.

Figure 8:
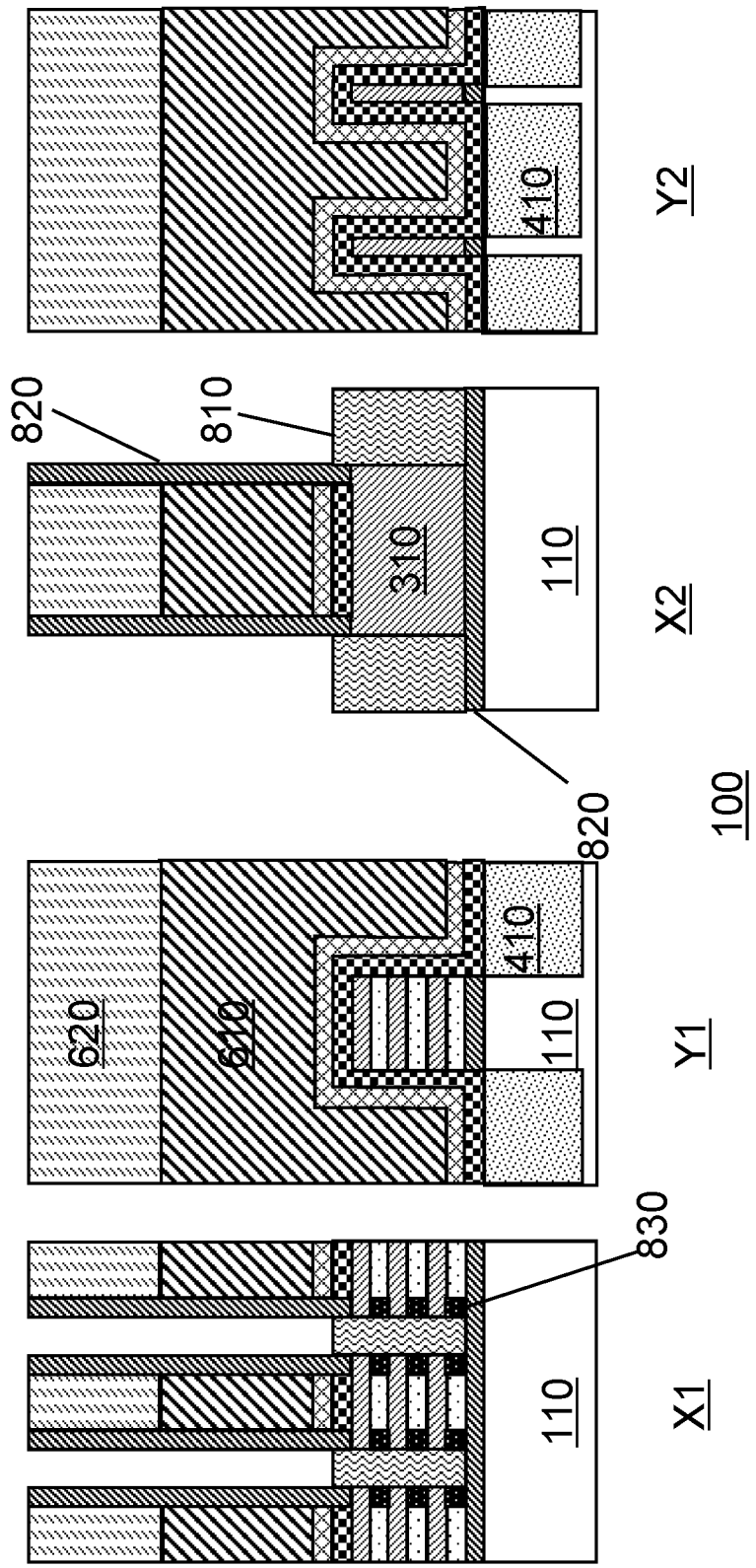
FIG. 8 provides a cross-sectional view of a step in the fabrication of a semiconductor device, according to an embodiment of the invention. The figure illustrates the device after the deposition of a protective sacrificial dielectric around the dummy gates and beneath the FET and floating gate memory cell fins, the formation of FET inner spacers, and the epitaxial growth of device source/drain regions.

FIG. 8 illustrates device 100 following the deposition and subsequent etching, such as anisotropic etching to remove material from horizontal surfaces, of gate sidewall spacers 820 adjacent to the vertical surfaces of dummy gate materials 610 and hardmask 620. In an embodiment, gate sidewall spacer material 820, may be the same material as hardmask 620, or may be different materials and may be comprised of any one or more of a variety of different insulative materials, such as $Si_3N_4$, SiBCN, SiNC, SiN, SiCO, $SiO_2$, SiNOC, etc. In this embodiment, after conformal deposition, selective etching, such as anisotropic reactive ion etching, removes gate sidewall spacer material 820 from horizontal surfaces of the intermediate stage of the device 100. Voids formed by removal of sacrificial layer 120 are also filled in this process step with the same material deposited to form gate sidewall spacers 820.

FIG. 8 illustrates device 100 following the etching of nanosheets 130, 140, between dummy gate structures, and the formation of inner spacers between adjacent nanosheet channel layers 140, yielding individual gate structures. Selective anisotropic etching such as RIE removes portions of the alternating sacrificial layers 130 and channel layers 140 from between adjacent dummy gate structures. Protective gate sidewall spacers 820 prevent damage to the dummy gate structures. The nanosheet layer portions are removed to the upper surface of the material 820 deposited in the voids left after removal of sacrificial semiconductor material 120, as illustrated in FIG. 7.

FIG. 8 further illustrates device 100 following formation of inner spacers 830 between nanosheets of the respective FET devices. Portions of nanosheet stack layers 130, and 140, which are not underneath gate sidewall spacers 820 and not underneath dummy gate 610 are removed.

After generally etching the nanosheet stack, a selective etching of SiGe layers 130 of the nanosheet stack removes portions of the layers which are underneath gate sidewall spacers 820. Inner spacers 830 are then formed in etched portions and thus are located under gate sidewall spacers 820. Inner spacers 830 can be composed of any suitable dielectric material, for example $Si_3N_4$, SiBCN, SiNC, SiN, SiCO, $SiO_2$, SiNOC, etc. The inner spacers 830 are formed by a conformal dielectric liner deposition followed by isotropic etching back, so dielectric liner is removed everywhere except the regions pinched-off in those under spacer cavities.

FIG. 8 further illustrates device 100 following epitaxial growth of device source/drain regions 810, for the FET and floating gate memory devices. Epitaxial growth of the S/D regions proceeds from the exposed edges of the nanosheet channels 140, and exposed floating gate memory cell fins 310.

In the present embodiments, the source-drain regions 810 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Figure 9:
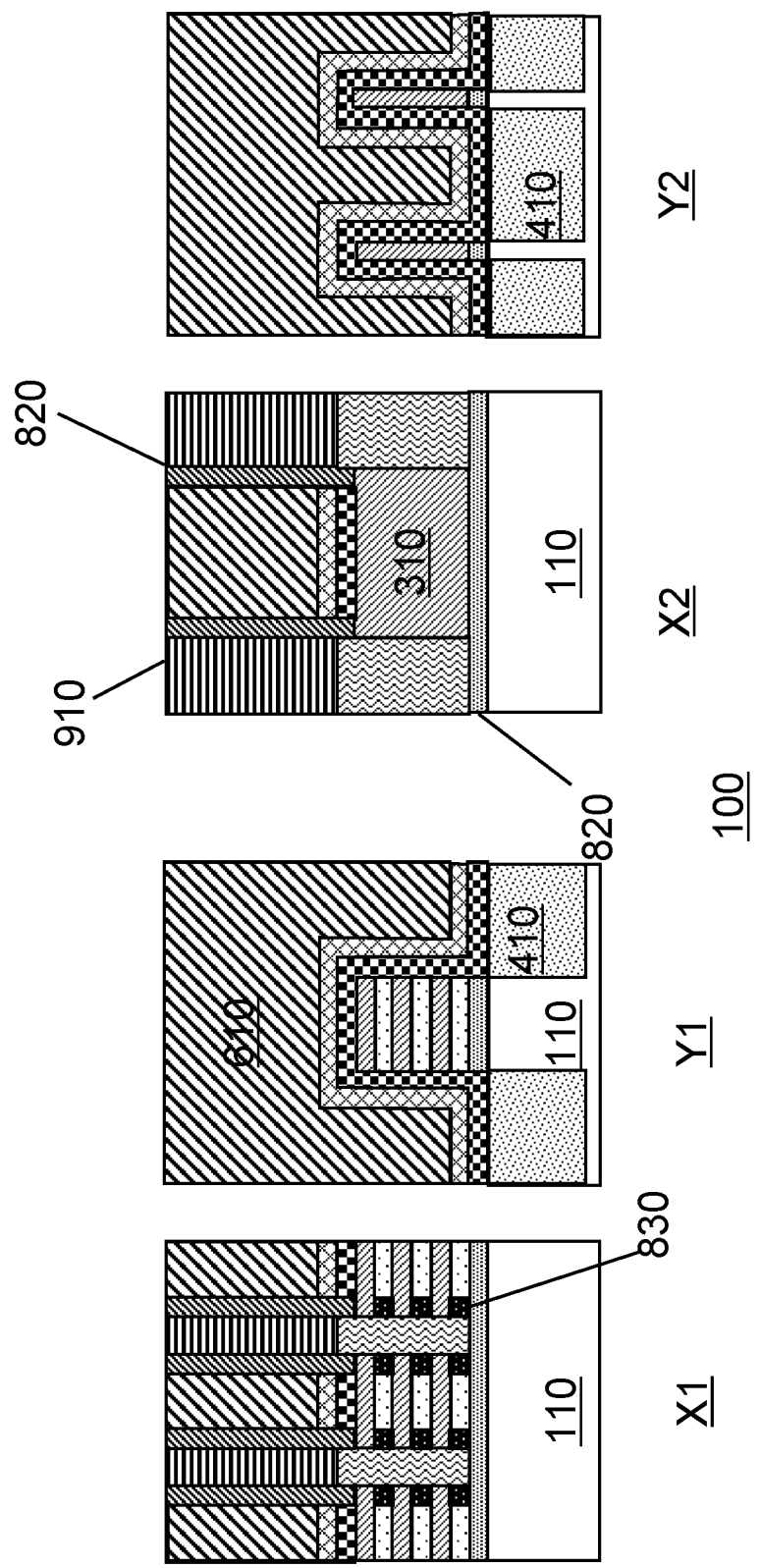
FIG. 9 provides a cross-sectional view of a step in the fabrication of a semiconductor device, according to an embodiment of the invention. The figure illustrates the device after removal of the sacrificial hardmask and deposition of interlayer dielectric material.

FIG. 9 illustrates device 100 following encapsulation of the dummy gates with an interlayer dielectric 910, such as a flowable silicon oxide material. The figure further illustrates the device following CMP of the device, removing hardmask 620 and portions of gate sidewall spacers 820, to the upper surface of sacrificial dummy gate material 610.

Figure 10:
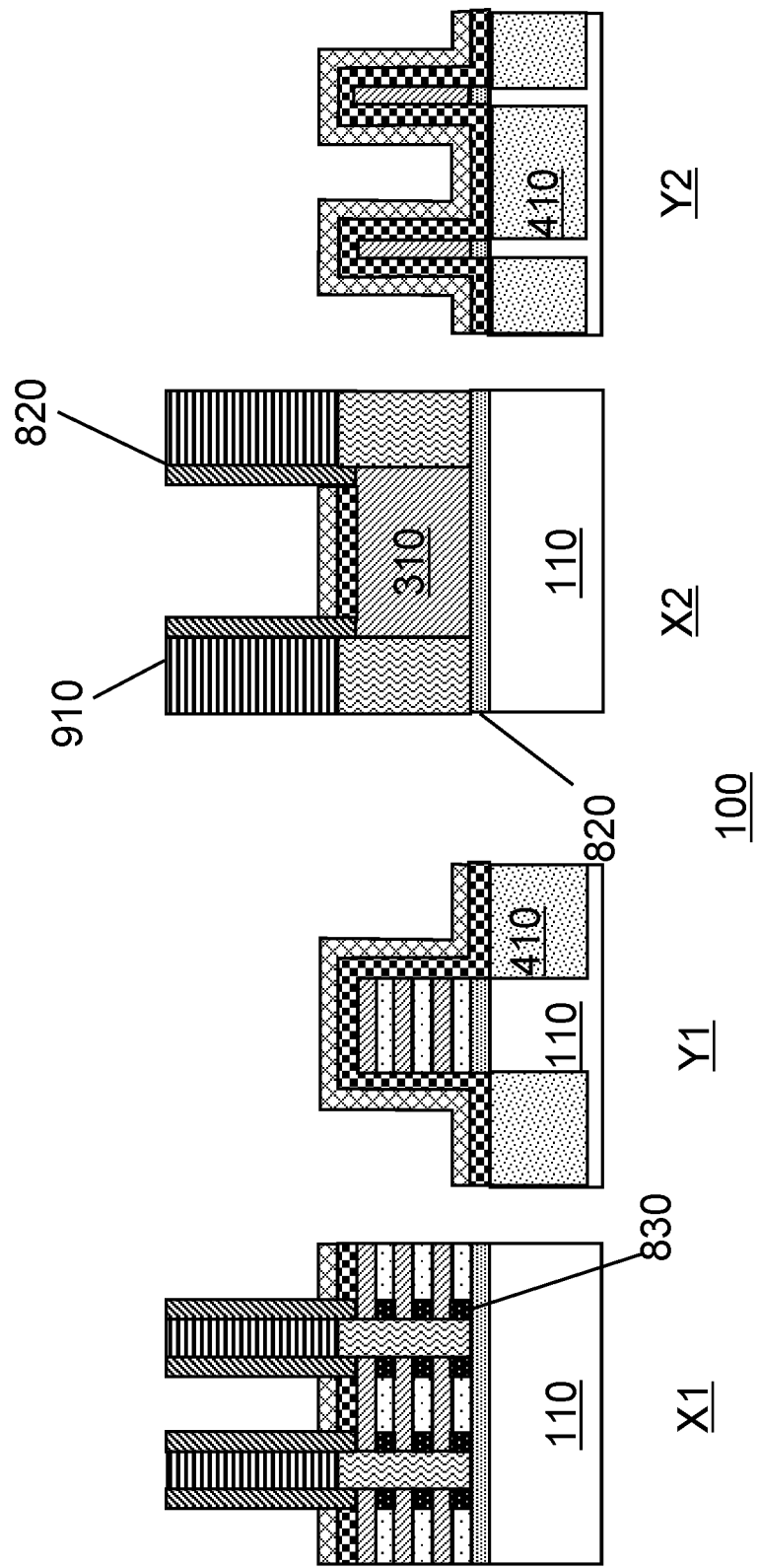
FIG. 10 provides a cross-sectional view of a step in the fabrication of a semiconductor device, according to an embodiment of the invention. The figure illustrates the device after the removal of material to expose the floating gate material layer.

FIG. 10 illustrates device 100 following the selective release and removal of sacrificial dummy gate material 610, exposing the poly-crystalline silicon floating gate memory material 520. Sacrificial layers 130 disposed between semiconductor channel layers 140, remain undisturbed during this release of sacrificial material 610.

Figure 11:
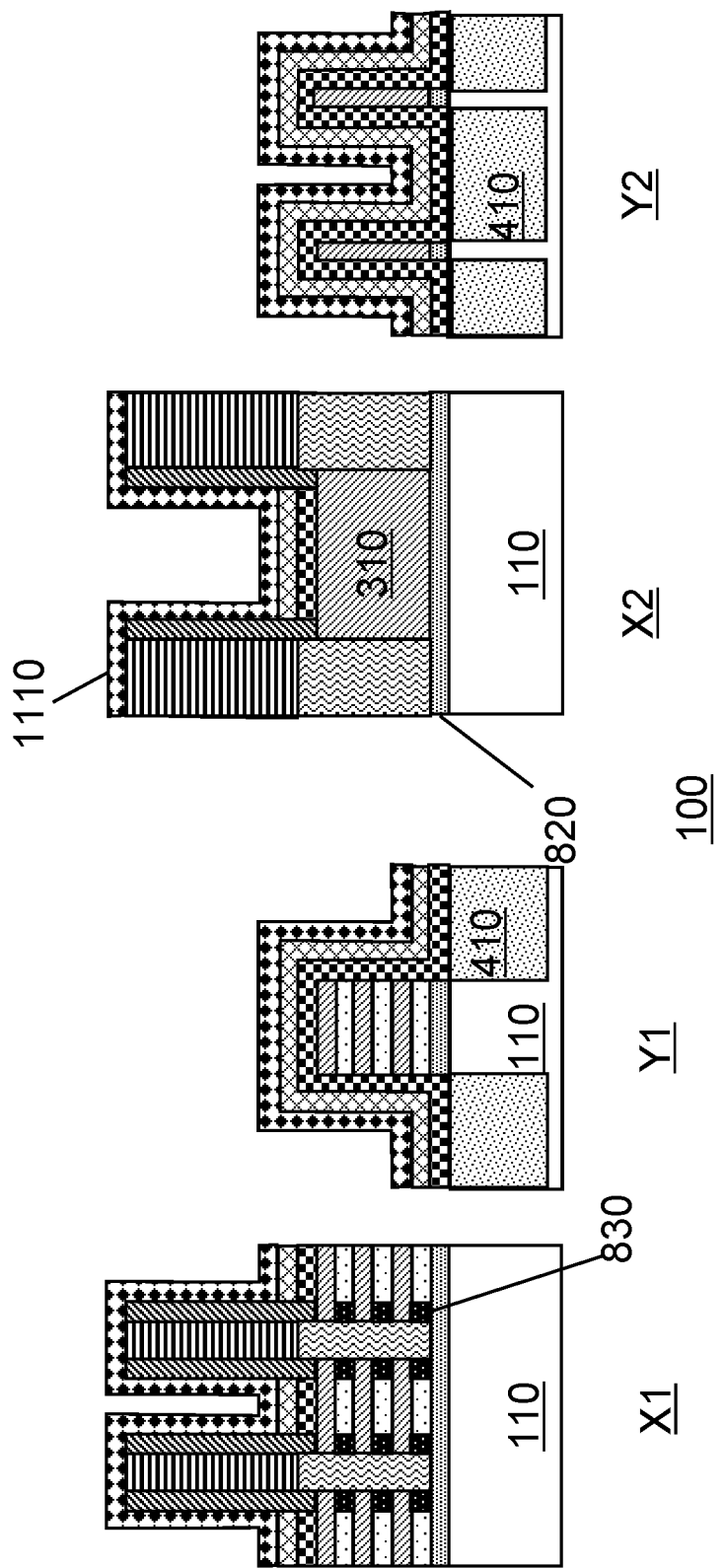
FIG. 11 provides cross-sectional views of a step in the fabrication of a semiconductor device, according to an embodiment of the invention. The figure illustrates the device after deposition of a blocking oxide layer upon the floating gate material layer.

FIG. 11 illustrates device following conformal deposition of an upper blocking dielectric layer 1110 covering the floating gate memory poly-crystalline Si layer 520. A dielectric material similar to that of tunneling dielectric layer 510 deposited using ALD, CVD or similar methods convers the floating gate memory material layer 520.

Figure 12:
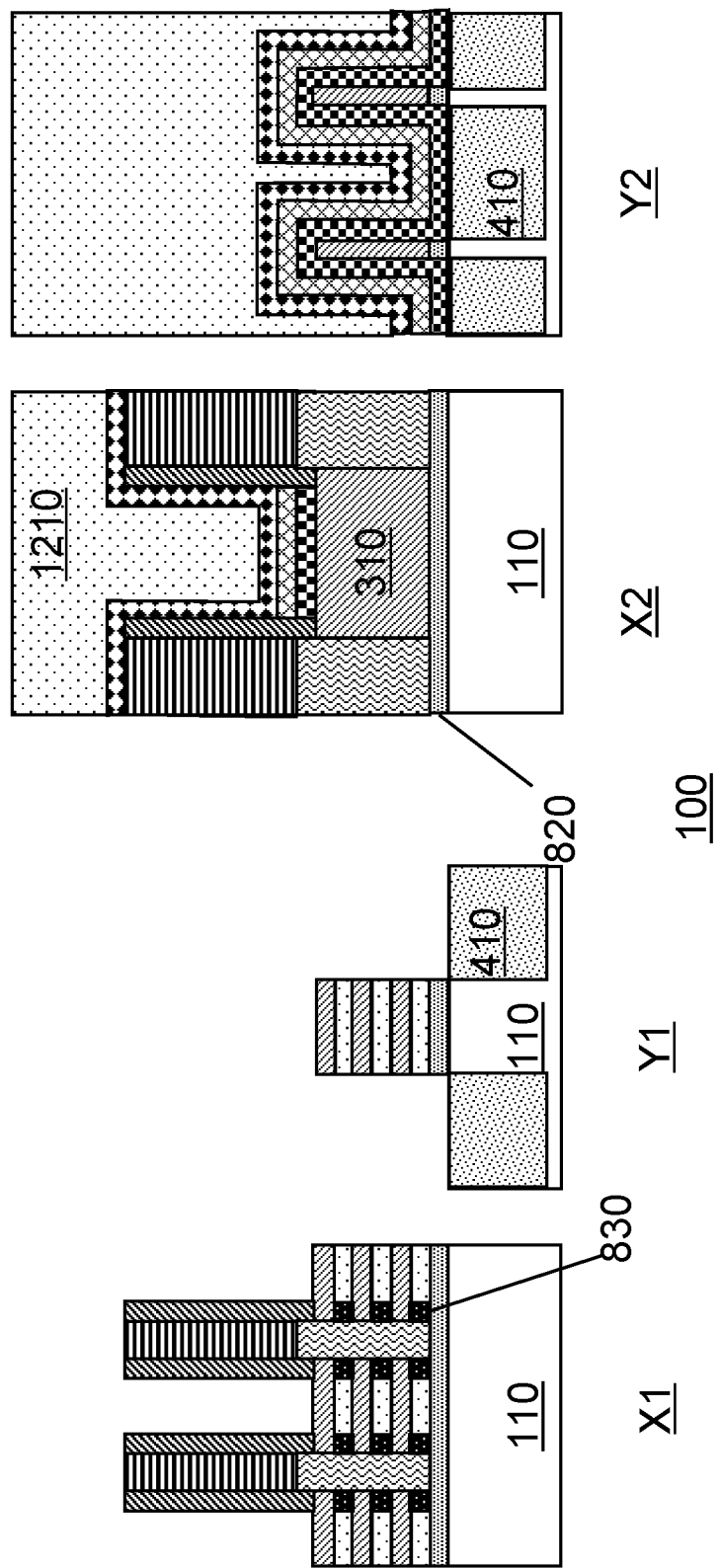
FIG. 12 provides cross-sectional views of a step in the fabrication of a semiconductor device, according to an embodiment of the invention. The figure illustrates the device after removal of floating gate material and tunneling layers from the FET.

FIG. 12 illustrates device 100 following the formation of a protective mask for the floating gate memory portion of the device followed by removal of the upper floating gate memory blocking dielectric layer 1110, floating gate memory poly-crystalline layer 520, and tunneling dielectric layer 510 from the nanosheet FET devices region. A soft mask such as OPL material 1210, can be coated and patterned to protect floating gate memory structure including tunneling dielectric 510, poly-Si layer 520, and upper gate dielectric 1110, on this portion of the device from selective etching. These layers are removed from the FET portion of the device, exposing the NS stacks inside the gate structures of the FET devices.

Figure 13:
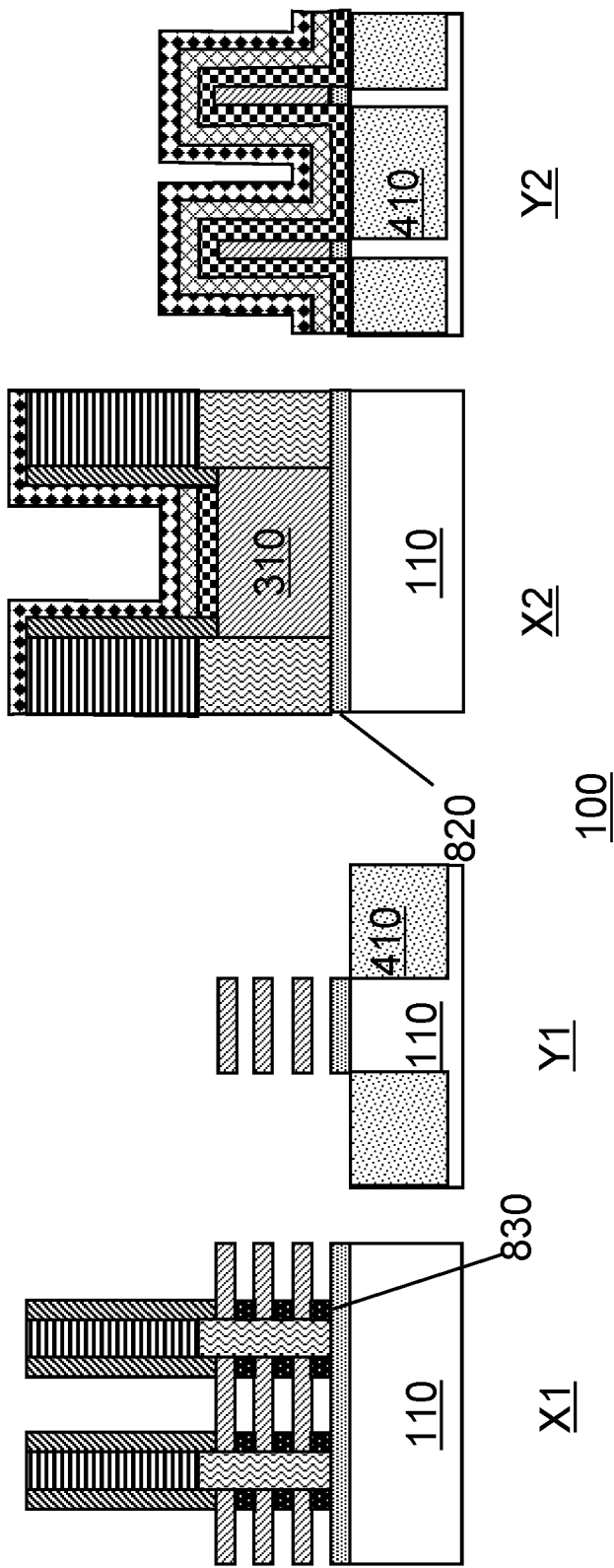
FIG. 13 provides cross-sectional views of a step in the fabrication of a semiconductor device, according to an embodiment of the invention. The figure illustrates the device after removal of sacrificial material from the FET gate regions.

FIG. 13 illustrates device 100 following release and removal of sacrificial material layers 130 from the NS stacks of the FET devices. NS channel layers 140, inner spacers 830, S/D regions 810 and ILD portions 910 remain intact after this removal. The Figure further illustrates device 100 following removal of the floating gate memory protect OPL mask through, for example, an ashing process.

Figure 14:
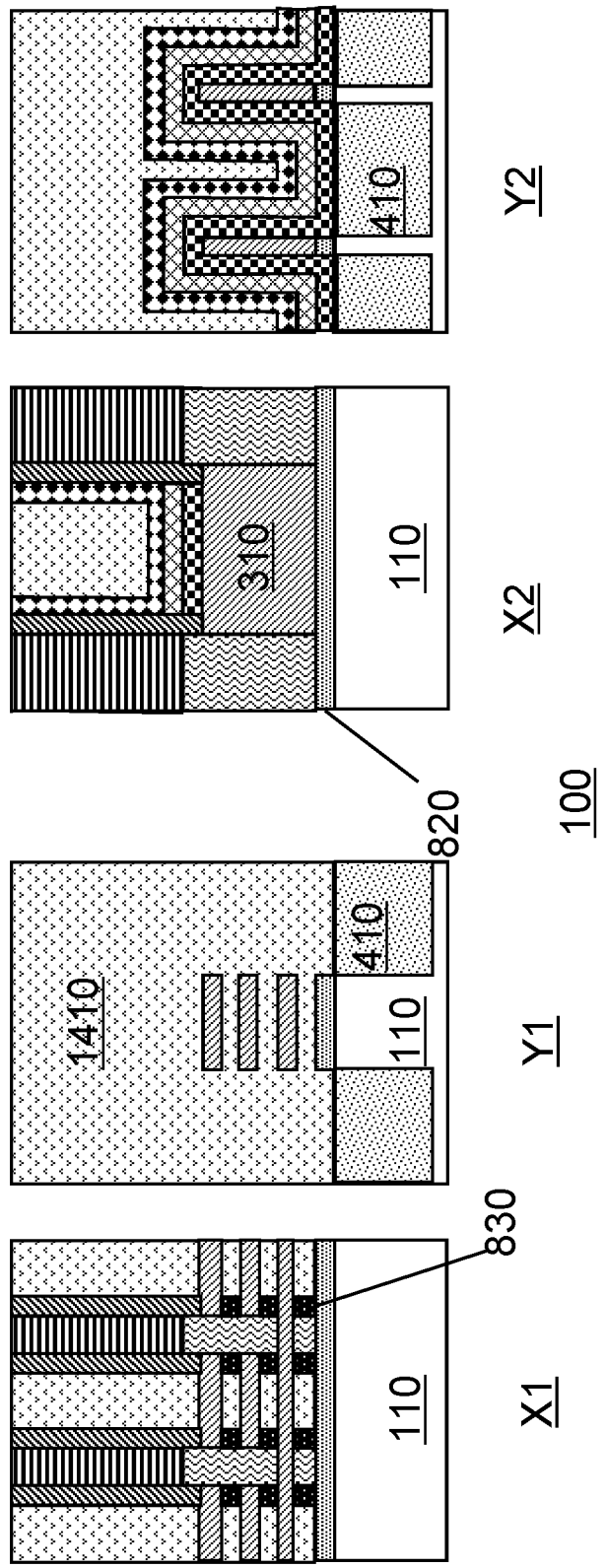
FIG. 14 provides cross-sectional views of a step in the fabrication of a semiconductor device, according to an embodiment of the invention. The figure illustrates the device after formation of the replacement metal gates.

FIG. 14 illustrates device 100 following formation of replacement high-k metal gate stacks for the FET and floating gate memory structures. FIG. 14 illustrates device 100 following the removal of sacrificial SiGe 130, and formation of the high-k metal gate (HKMG) stack 1410. As shown in the Figure, a replacement high-k metal gate structure has been formed in the void space created by removal of the dummy gate 610, and sacrificial SiGe 130. Gate structure 1410 includes gate dielectric and gate metal layers (not shown). The gate dielectric is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gate can include any known metal gate material known to one skilled in the art, e.g., TiN, TiAl, TiC, TiAlC, tantalum (Ta) and tantalum nitride (TaN), W, Ru, Co, Al. In an embodiment, a high-k material, such as halfinium oxide, is disposed upon all exposed surfaces of the FET and floating gate memory cell structures prior to deposition of the metal gate contact. In this embodiment, CVD, ALD, or similar deposition methods deposit a thin film of a high-k material upon all exposed surfaces of the FET and floating gate memory illustrated in FIG. 13.

Metal gates may be formed via known deposition techniques, such as atomic layer deposition, chemical vapor deposition, or physical vapor deposition. It should be appreciated that a chemical mechanical planarization (CMP) process can be applied to the top surface. In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG, the HKMG can be optionally recessed followed by a deposition and CMP of a gate cap dielectric material (not shown), such as SiN, or similar materials, completing the replacement metal gate fabrication stage for the device.

Following formation of the high-k metal gate contact, contacts may be etched through ILD material 910, exposing portions of S/D regions 810. Such contacts enable the deposition of conductive materials for the formation of S/D contacts for the FET and floating gate memory cells. Additional fabrication steps associated with higher levels of the overall device as well as final device external contacts and packaging occur following the concurrent formation of the FET and floating gate memory cells.

Figure 15:
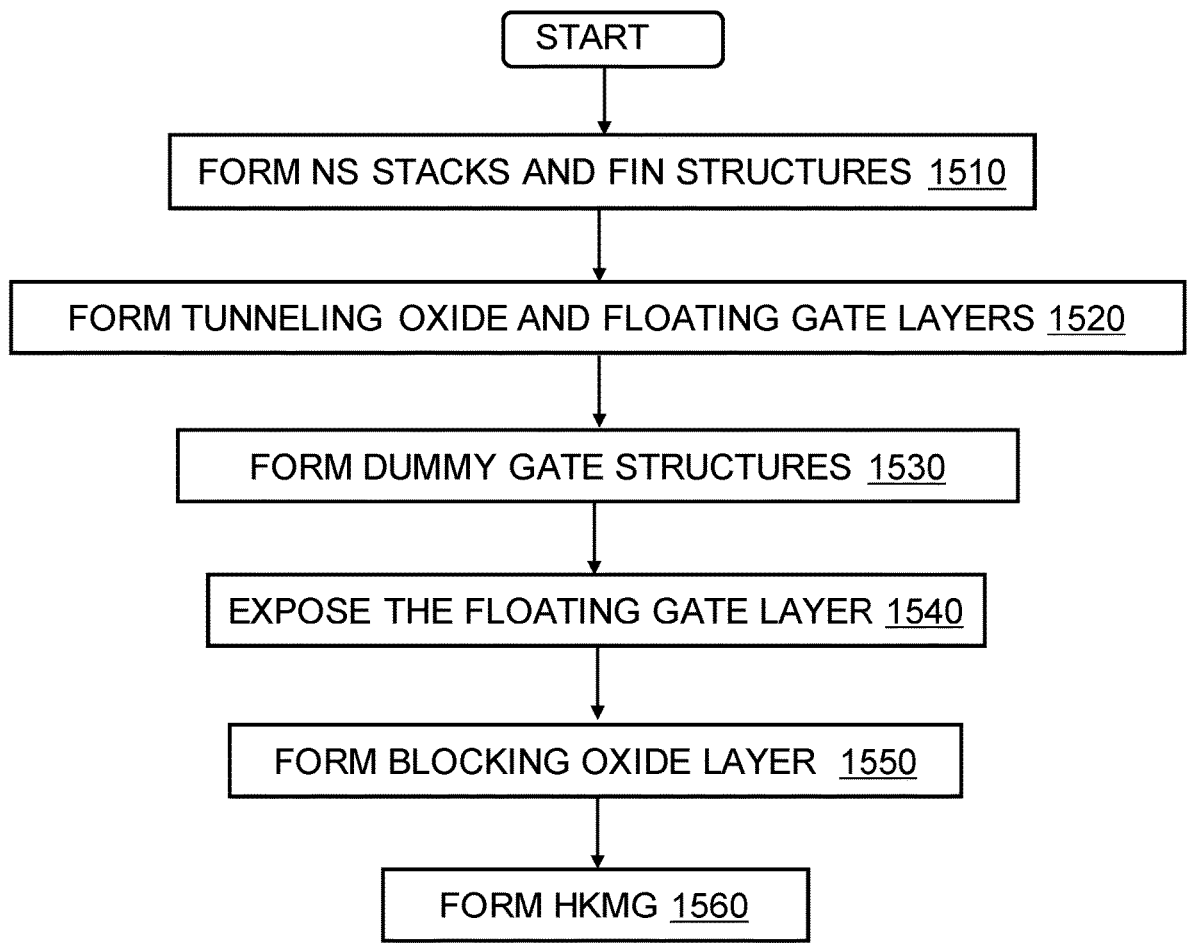
FIG. 15 provides a flowchart depicting operational steps for forming semiconductor device, according to an embodiment of the invention.

Flowchart 1500 of FIG. 15 depicts a sequence of fabrication steps associated with fabrication of disclosed devices. At block 1510, deposition of a stack of nanosheets upon an underlying substrate occurs. In an embodiment, the stack includes a first sacrificial material layer followed by alternating layers of differing semiconductor material. In this embodiment, the stack includes the first sacrificial layer as well as semiconductor channel layers and additional sacrificial layers. The materials of the first sacrificial layer differ from those of additional sacrificial layers.

In an embodiment, selective etching of the nanosheet stack and deposition of new semiconductor material enables the formation of fin stacks of nanosheets as well as semiconductor fins for the floating gate memory cells upon the lower sacrificial layer.

At block 1520, deposition of tunneling oxide and floating gate layers over the nanosheet stack and fin structures occurs. Conformal deposition processes provide uniform deposition of an isolating dielectric tunneling oxide material followed by deposition of a semiconductor material for the floating gate layer of the cells. Deposition of the layers occurs across both the FET nano sheet stacks and the floating gate fins.

At block 1530, formation of dummy gate structures above the FET nanosheets and floating gate fins occurs. Such structures include a sacrificial dummy gate material layer and a protective hardmask layer. Removal of portions of the floating gate and tunneling isolation layers above the FET nanosheet stacks occurs, exposing the nanosheet stacks between the dummy gate structures as well as portions of the floating gate fins adjacent to the floating gate memory dummy gate structure.

At block 1540, portions of the FET nanosheet stack and floating gate fins not protected by dummy gate and gate sidewall spacer structures are removed to the upper surface of a lower dielectric isolation layer, exposing the upper surfaces of the floating gate material layer. Formation of inner spacers between nanosheet channels occurs. Epitaxial growth of FET and floating gate source/drain regions from exposed edges of channel nanosheets and floating gate fins, then occurs.

At block 1550, deposition of an upper blocking oxide isolation material layer occurs over the exposed surfaces of the FET and floating gate devices. This layer forms the upper isolation/blocking layer of the floating gate memory cells.

At block 1560, formation of high-k metal gate contacts for each of the FET and floating gate memory cells occurs. Patterned masking protects floating gate memory cells during removal of the upper blocking layer, floating gate layer, and tunneling isolation layer, from above the FET nanosheet stacks. Deposition of a thin film of a high-k material upon all exposed FET and floating gate cell surfaces follows removal of sacrificial semiconductor nanosheets. Deposition of conductive gate contact material completes the formation of the high-k metal gate contacts for each of the FET and floating gate devices. Additional steps, including formation of device S/D contacts, additional device layer formation and final device contacts and external packaging, follow. In an embodiment, the high-k metal gate structure is formed above the blocking layer, floating gate layer, and tunneling oxide layers of the floating gate memory cell as well as adjacent to the vertical blocking layer portions disposed adjacent to the gate sidewall spacers of the floating gate memory cells. In this embodiment, the tunneling oxide, floating gate, and blocking oxide layers are disposed beneath the HKMG while only the blocking oxide is disposed beside the vertical sidewalls of the HKMG structure of the floating gate memory cells.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising: a nanosheet field effect transistor (FET) comprising a gate oxide layer; and
a floating gate memory cell comprising a tunneling oxide, a floating gate, a dielectric isolation layer, and a blocking oxide layer over a fin FET device.

2. The semiconductor device according to claim 1, wherein the tunneling oxide and floating gate layers are disposed beneath a gate contact and the blocking oxide is disposed beneath and beside the gate contact.

3. The semiconductor device according to claim 1, wherein the FET and floating gate memory cell are disposed at a common device level.

4. The semiconductor device according to claim 1, wherein the floating gate memory comprises a vertical blocking oxide layer disposed adjacent to a control gate.

5. The semiconductor device according to claim 1, wherein the FET further comprises a dielectric isolation layer.

6. The semiconductor device according to claim 1, wherein the floating gate memory cell further comprises a plurality of fins.

7. A method of fabricating a semiconductor device, the method comprising:
forming a nanosheet stack and fin structures;
forming tunneling oxide and floating gate layers over the nanosheet stack and fin structures;
forming dummy gate structures over the nanosheet stack and fin structures;
exposing the floating gate;
forming a blocking oxide layer over the floating gate; and
forming replacement metal gates.

8. The method according to claim 7, further comprising forming an oxide layer adjacent to the blocking oxide layer and the nanosheet stack.

9. The method according to claim 7, further comprising forming a dielectric isolation layer beneath a field effect transistor.

10. The method according to claim 7, further comprising forming a dielectric isolation layer beneath a floating gate memory cell.

11. The method according to claim 7, wherein the nanosheet stack and fin structures are formed at a common device level.

12. The method according to claim 7, wherein the replacement metal gate is formed adjacent to vertical blocking oxide layers.

13. The method according to claim 8, wherein the tunneling oxide and the floating gate layers are disposed beneath a gate contact and the blocking oxide is disposed beneath and beside the gate contact.

14. A method of fabricating a semiconductor device comprising a field effect transistor (FET) and a floating gate memory cell, the method comprising:
forming a nanosheet stack for the FET;
forming at least one fin structure for the floating gate memory;
forming tunneling oxide and floating gate layers over the fin structure;
forming dummy gate structures over the nanosheet stack and fin structures;
exposing the floating gate layer of the floating gate memory;
forming a blocking oxide layer over the floating gate; and
forming a replacement metal gate adjacent to the blocking oxide layer.

15. The method according to claim 14, wherein the tunneling oxide and the floating gate layers are disposed beneath a gate contact and the blocking oxide is disposed beneath and beside the gate contact.

16. The method according to claim 14, further comprising forming an oxide layer adjacent to the blocking oxide layer and the nanosheet stack.

17. The method according to claim 14, further comprising forming a dielectric isolation layer beneath a field effect transistor.

18. The method according to claim 14, further comprising forming a dielectric isolation layer beneath a floating gate memory cell.

19. The method according to claim 14, wherein the nano sheet stack and fin structures are formed at a common device level.

* * * * *